United States Patent
Takano et al.

(10) Patent No.: US 11,892,481 B2
(45) Date of Patent: Feb. 6, 2024

(54) CURRENT DETECTING CIRCUIT AND SWITCHING CIRCUIT

(71) Applicants: Yoichi Takano, Tokyo (JP); Kohei Sakurai, Tokyo (JP)

(72) Inventors: Yoichi Takano, Tokyo (JP); Kohei Sakurai, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 304 days.

(21) Appl. No.: 17/446,480

(22) Filed: Aug. 31, 2021

(65) Prior Publication Data

US 2022/0074973 A1  Mar. 10, 2022

(30) Foreign Application Priority Data

Sep. 9, 2020  (JP) ................................. 2020-151117

(51) Int. Cl.
*G01R 19/00*  (2006.01)
*H03K 17/16*  (2006.01)
*G01R 19/10*  (2006.01)

(52) U.S. Cl.
CPC ....... *G01R 19/0092* (2013.01); *H03K 17/163* (2013.01); *H03K 17/166* (2013.01)

(58) Field of Classification Search
CPC ........... H03F 1/083; H03F 2203/45302; G01R 19/0092
See application file for complete search history.

(56) References Cited

U.S. PATENT DOCUMENTS

| 6,573,693 B2 | 6/2003 | Okamoto |
| 7,323,850 B2 | 1/2008 | Ryu et al. |
| 2008/0186100 A1* | 8/2008 | Okanobu ............ H03F 3/45659 330/285 |
| 2011/0163730 A1* | 7/2011 | Zhang .................. H02M 3/158 323/234 |
| 2012/0025913 A1* | 2/2012 | Honda ................ H03F 3/45183 330/291 |
| 2013/0033323 A1* | 2/2013 | Scuderi .................... G01D 1/10 330/252 |
| 2018/0219519 A1* | 8/2018 | Schober .................. H03F 3/211 |

FOREIGN PATENT DOCUMENTS

| JP | 2002-091584 | 3/2002 |
| JP | 2006-050724 | 2/2006 |

* cited by examiner

*Primary Examiner* — Jermele M Hollington
*Assistant Examiner* — Temilade S Rhodes-Vivour
(74) *Attorney, Agent, or Firm* — IPUSA, PLLC

(57) ABSTRACT

A current detecting circuit includes a first switching element, a second switching element, and a third switching element electrically coupled in series with the first switching element. An output side of the third switching element is electrically coupled to an output terminal. The current detecting circuit includes a current amplifier configured to detect a difference between a first output voltage of the first switching element and a second output voltage of the second switching element. The current amplifier outputs a relative current to be used for detecting an output current that flows out from the output terminal. A ratio of resistance associated with the first switching element to resistance associated with the second switching element is n:1.

19 Claims, 5 Drawing Sheets

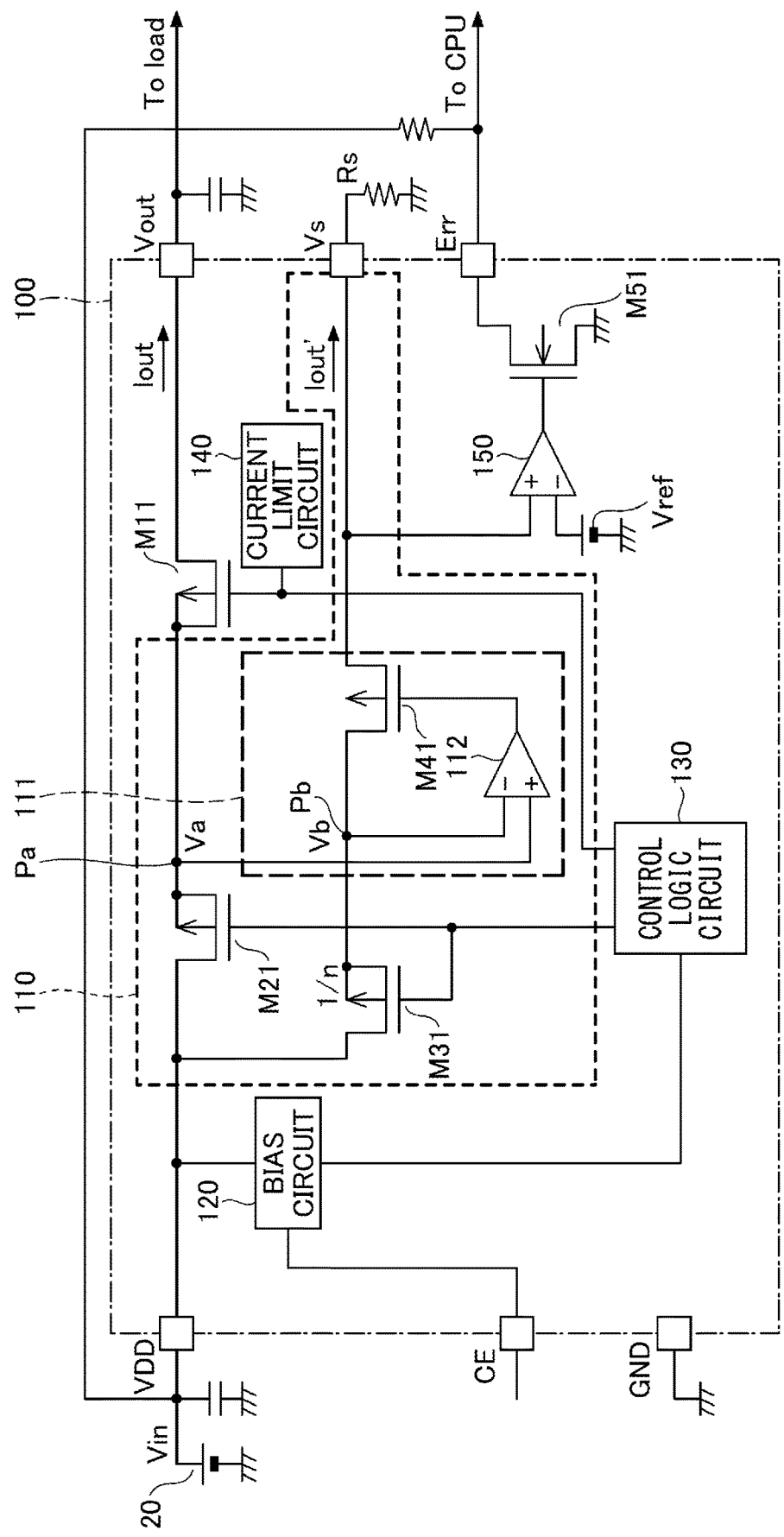

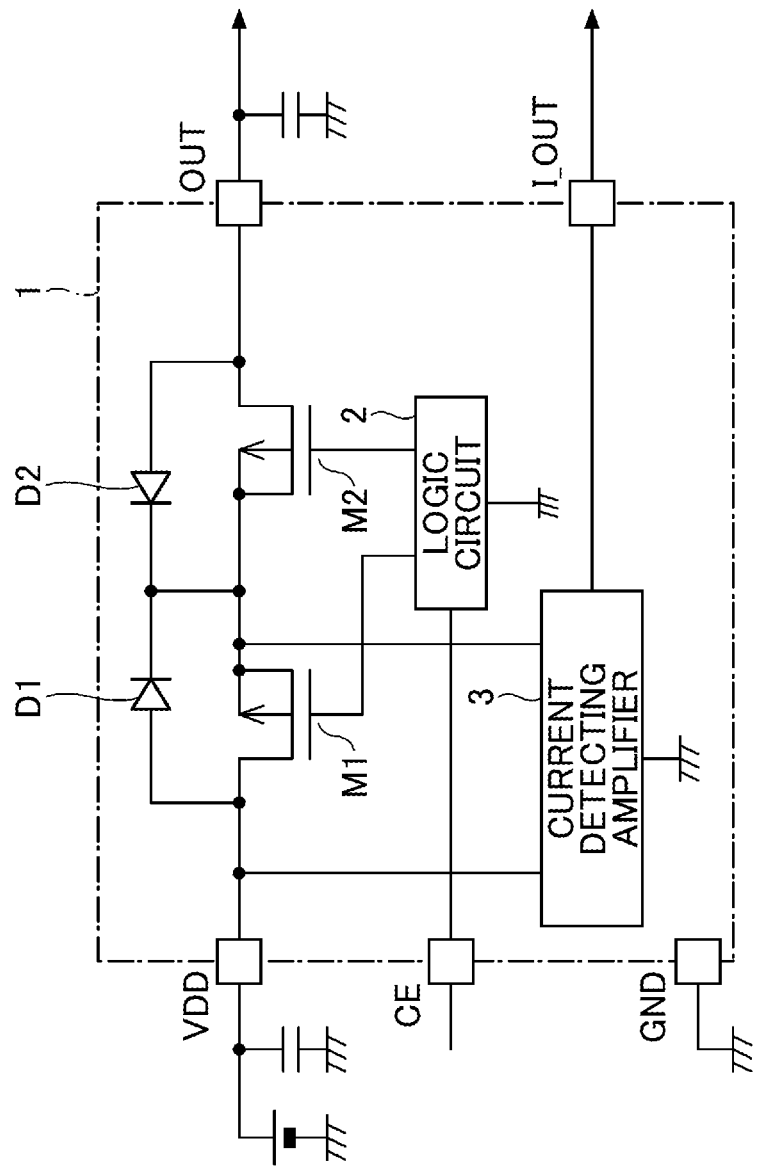

CURRENT DETECTING CIRCUIT AND SWITCHING CIRCUIT

CROSS-REFERENCE TO RELATED APPLICATION

This application claims priority under 35 U.S.C. § 119 to Japanese Patent Application No. 2020-151117, filed Sep. 9, 2020, the contents of which are incorporated herein by reference in their entirety.

BACKGROUND

1. Field of the Invention

The present disclosure relates to a current detecting circuit and a switching circuit.

2. Description of the Related Art

High-side switching circuits have been known to be each coupled between a power source and a load. FIG. 5 illustrates a high-side switching circuit in related art. In FIG. 5, a high-side switching circuit 1 includes transistors M1 and M2, a logic circuit 2, and a current detecting amplifier 3.

The transistors M1 and M2 are p metal-oxide-semiconductor (PMOS) transistors, and are coupled in series between a VDD terminal and an OUT terminal. In the high-side switching circuit 1, when the logic circuit 2 turns the transistors M1 and M2 on, a current delivered from the VDD terminal is output from the OUT terminal. The current output from the OUT terminal is provided to a load subsequent to the high-side switching circuit 1, as an output current of the high-side switching circuit 1.

A back gate of each of the transistors M1 and M2 is coupled at a connection point of the transistor M1 and the transistor M2. A cathode of a parasitic diode D1 of the transistor M1 is provided facing a cathode of a parasitic diode D2 of the transistor M2. Thus, due to short-circuiting or the like in the high-side switching circuit 1, if a potential at the OUT terminal becomes higher than a potential at the VDD terminal, the parasitic diode D1 of the transistor M1 prevents backflow of the current.

The logic circuit 2 turns on or off each of the transistors M1 and M2, in response to receiving a signal from a CE terminal. The current detecting amplifier 3 detects a current between a source and a drain of the transistor M1. The current detecting amplifier 3 also outputs, from an I_OUT terminal, the detected current, as a detection current used to detect the output current flowing out from the OUT terminal.

In such a configuration, the high-side switching circuit 1 detects the output current to thereby detect connection between the OUT terminal and a given load subsequent to the OUT terminal.

CITATION LIST

Patent Document

Patent document 1: Japanese Unexamined Patent Application Publication No. 2002-91584
Patent document 2: Japanese Unexamined Patent Application Publication No. 2006-50724

SUMMARY

According to the techniques described below, a current detecting circuit includes a power supply terminal and an output terminal. The current detecting circuit includes a first switching circuit of which an input side is electrically coupled to the power supply terminal, the first switching circuit including a first control terminal. The current detecting circuit includes a second switching circuit of which an input side is electrically coupled to the power supply terminal, the second switching circuit including a second control terminal electrically coupled to the first control terminal of the first switching circuit. The current detecting circuit includes a third switching circuit electrically coupled in series with the first switching circuit, an output side of the third switching circuit being electrically coupled to the output terminal. The current detecting circuit includes a current amplifier configured to detect a difference between a first output voltage of the first switching circuit and a second output voltage of the second switching circuit. The current amplifier is configured to output a relative current to be used for detecting an output current that flows out from the output terminal. A ratio of resistance associated with the first switching circuit to resistance associated with the second switching circuit is n:1, where n is an integer greater than one.

Also, according to the techniques described below, a current detecting circuit includes a power supply terminal and an output terminal. The current detecting circuit includes a first switching circuit of which an input side is electrically coupled to the power supply terminal, the first switching circuit including a first control terminal. The current detecting circuit includes a second switching circuit of which an input side is electrically coupled to the power supply terminal, the second switching circuit including a second control terminal electrically coupled to the first control terminal of the first switching circuit. The current detecting circuit includes a third switching circuit electrically coupled in series with the first switching circuit, an output side of the third switching circuit being electrically coupled to the output terminal, and the third switching circuit including a third control terminal. The current detecting circuit includes a fourth switching circuit electrically coupled in series with the second switching circuit, the fourth switching circuit including a fourth control terminal electrically coupled to the third control terminal of the third switching circuit. The current detecting circuit includes a current amplifier configured to detect a difference between a first output voltage of the third switching circuit and a second output voltage of the fourth switching circuit. The current amplifier is configured to output a relative current to be used for detecting an output current that flows out from the output terminal. A ratio of resistance associated with the first switching circuit to resistance associated with the second switching circuit is n:1, where n is an integer greater than one. A ratio of resistance associated with the third switching circuit to resistance associated with the fourth switching circuit is m:1, where m is an integer greater than one.

BRIEF DESCRIPTION OF THE DRAWINGS

FIG. 2 is a diagram illustrating an example of the configuration of the switching circuit according to the first embodiment;

FIG. 5 is a diagram illustrating a high-side switching circuit in related art.

DESCRIPTION OF THE EMBODIMENTS

Related art information relevant to the present disclosure recognized by the inventors of this application will be provided below. In the high-side switching circuit illustrated in FIG. 5, there are variations in on-resistance associated with transistors, voltage dependency, temperature dependency, and the like of each transistor. Thus, it is difficult to detect a given detection current accurately and consequently the output current of the high-side switching circuit might not be detected accurately.

In view of the above situation, an object of the techniques according to the embodiments is to increase accuracy in detecting a given current.

First Embodiment

Figure 1:
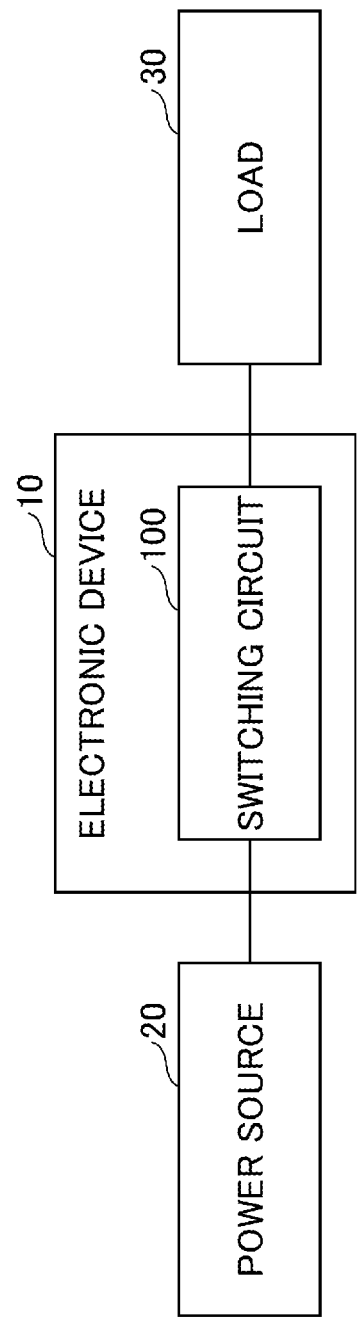
FIG. 1 is a diagram illustrating an example of how a switching circuit may be applied according to a first embodiment.

A first embodiment is described below with reference to the drawings. FIG. 1 is a diagram illustrating an example of how a switching circuit may be applied according to a first embodiment.

A switching circuit 100 according to the present embodiment is a high-side switching circuit that is embedded in an electronic device 10. The electronic device 10 is coupled between a power source 20 and a load 30.

For example, the electronic device 10 is an electronic device for a vehicle, such as a car navigation system. Examples of the power source 20 include a direct current (DC) power source, a battery, and the like. Examples of the load 30 include a global positioning system (GPS) antenna, a radio, a television device, a camera for a vehicle, and the like to be coupled to the electronic device The switching circuit 100 according to the present embodiment provides a current delivered from the power source 20, to the load 30. Also, the switching circuit 100 according to the present embodiment detects the magnitude of the current that is delivered from the power source 20 to the load 30, and then detects (i) connection of the load 30 to the electronic device 10 or (ii) disconnection of the load 30 from the electronic device 10, based on the detected current magnitude. Further, the switching circuit 100 prevents backflow to protect against the current from the load 30 into the power source 20.

FIG. 2 is a diagram illustrating the switching circuit according to the present embodiment. The switching circuit 100 according to the present embodiment includes a current detecting circuit 110, a bias circuit 120, a logic circuit 130, a current limit circuit 140, and a comparator (comparison circuit) 150. The switching circuit 100 also includes a transistor M11 (third switching element), a transistor M51, a VDD terminal (power supply terminal), and a CE terminal. The switching circuit 100 further includes a GND terminal, a Vout terminal (output terminal), a Vs terminal, and an Err terminal.

In the switching circuit 100, the VDD terminal is coupled to the power source 20. The Vout terminal is coupled to the load 30, which is subsequent to the electronic device 10 that includes the switching circuit 100. The CE terminal is coupled to a higher level circuit or the like of the switching circuit 100 to thereby receive various control signals. The GND terminal is grounded.

The Vs terminal is grounded via a resistor Rs. The resistor Rs is a resistor used to detect a relative current Iout' that is derived from an output current Iout flowing out from the switching circuit 100, and a resistance value may be variable. In this example, the resistor Rs is an element across which a voltage occurs in response to the relative current Iout'.

The relative current Iout' is a current used to detect the output current Iout. The relationship between the relative current Iout' and the current Iout will be described below.

The Err terminal is coupled to a central processing unit (CPU) or the like, which is a higher level circuit of the switching circuit 100. An error signal indicating the output current Iout is less than or equal to a threshold is output to the higher level circuit from the Err terminal, based on a detected result by the current detecting circuit 110.

The current detecting circuit 110 includes a current amplifier 111, a transistor M21 (first switching element), and a transistor M31 (second switching element). The current amplifier 111 includes a transistor M41 and an amplifier 112. In the present embodiment, each of the transistors in the switching circuit 100 is a MOS transistor (switching element).

In the current detecting circuit 110, an input side of each the transistor M21 and the transistor M31 is coupled to the VDD terminal. A gate, which is a control terminal, of the transistor M21 is coupled to a gate, which is a control terminal, of the transistor M31. The transistor M21 and the transistor M31 are turned on or off in synchronization.

In the present embodiment, the transistor M31 has the same structure as the transistor M21. The size of the transistor M31 is 1/n times the size of the transistor M21, where n is an integer greater than one.

An output side of the transistor M21 is coupled to an input side of the transistor M11. In this description, a connection point of the output side of the transistor M21 and the input side of the transistor M11 is a connection point Pa. A voltage at the connection point Pa is a voltage Va.

A back gate of each of the transistor M21 and the transistor M11 is coupled at the connection point Pa of the transistor M21 and the transistor M11. A parasitic diode is coupled in antiparallel with the transistor M21, in order to prevent backflow from the Vout terminal into the VDD terminal. A parasitic diode is coupled in parallel with the transistor M11, such that the current flows in a forward direction from the VDD terminal to the Vout terminal. A cathode of the parasitic diode of the transistor M21 is provided facing a cathode of the parasitic diode of the transistor M11. Thus, due to short-circuiting or the like in the switching circuit 100, if a potential at the Vout terminal becomes higher than a potential at the VDD terminal, the parasitic diode of the transistor M21 prevents backflow of the current.

The input side of the transistor M21 is coupled to the VDD terminal, and the bias circuit 120 is coupled at a node between the input side of the transistor M21 and the VDD terminal. Also, the input side of the transistor M31 is coupled at a node between the input side of the transistor M21 and the VDD terminal. An output side of the transistor M11 is coupled to the Vout terminal.

An output side of the transistor M31 is coupled to an input side of the transistor M41. In this description, a connection point of the output side of the transistor M31 and the input side of the transistor M41 is a connection point Pb, and a voltage at the connection point Pb is a voltage Vb.

A back gate of each of the transistor M31 and the transistor M41 is coupled at the connection point Pb. A parasitic diode is coupled in antiparallel with the transistor M31, in order to prevent backflow from the Vs terminal into the VDD terminal. A parasitic diode is coupled in parallel with the transistor M41, such that the current flows in a forward direction from the VDD terminal to the Vs terminal. A cathode of the parasitic diode of the transistor M31 is provided facing a cathode of the parasitic diode of the transistor M41. Thus, due to short-circuiting or the like in the switching circuit 100, if a potential at the Vs terminal becomes higher than a potential at the VDD terminal, the parasitic diode of the transistor M31 prevents backflow to protect against the current from the Vs terminal to the VDD terminal.

In the present embodiment, the parasitic diode of the transistor M21 and the parasitic diode of the transistor M31 are anti-backflow elements.

In the current amplifier 111, a non-inverting input of the amplifier 112 is coupled at the connection point Pa, an inverting input of the amplifier 112 is coupled at the connection point Pb, and an output of the amplifier 112 is coupled to a gate of the transistor M41. The current amplifier 111 detects a difference between an output voltage of the transistor M21 and an output voltage of the transistor M31, and outputs a given relative current Iout'. In such a case, the current amplifier 111 outputs the given relative current Iout' corresponding to a difference between on-resistance associated with the transistor M21 and on-resistance associated with the transistor M31.

An output side of the transistor M41 is coupled to the Vs terminal, and a non-inverting input of a comparator 150 is coupled at a node between the output side of the transistor M41 and the Vs terminal. A voltage at an inverting input of the comparator 150 is set to be a reference voltage Vref. Also, an output of the comparator 150 is coupled to a gate of a transistor M51. The transistor M51 is coupled between a ground and the Err terminal.

The bias circuit 120 is coupled at a node between the VDD terminal and the input side of the transistor M21. The bias circuit 120 is also coupled to each of the CE terminal and the logic circuit 130. The bias circuit 120 generates a bias voltage in accordance with a control signal that is received from the CE terminal, where the bias voltage is generated based on a power supply voltage fed via the VDD terminal. The bias circuit 120 also supplies the generated bias voltage to the logic circuit 130. The bias circuit 120 further outputs the control signal received from the CE terminal, to the logic circuit 130. Note that although not illustrated in FIG. 2, the bias circuit 120 also supplies a given bias voltage to a circuit other than the logic circuit 130 in the switching circuit 100.

The logic circuit 130 is coupled to each of the bias circuit 120, the gate of the transistor M11, and the gate of the transistor M21. The gate of the transistor M31 is coupled at a node between the gate of the transistor M21 and the logic circuit 130, and the current limit circuit 140 is coupled at a node between the gate of the transistor M11 and the logic circuit 130.

In response to receiving a signal from the bias circuit 120, the logic circuit 130 applies a signal at high level or low level, to the gate of each of the transistors M11, M21, and M31, to thereby turn on or off a corresponding transistor among the transistors M11, M21, and M31. In this description, the gate of each of the transistors M11, M21, and M31 is a control terminal that controls supply of the output current Iout flowing from the VDD terminal.

In response to receiving the signal output from the logic circuit 130, the current limit circuit 140 limits the magnitude of the current Iout, such that the magnitude of the current Iout does not exceed an upper limit that is determined by taking into account the load 30.

Hereafter, the relationship between the relative current Iout' and the output current Iout according to the present embodiment will be described. In the present embodiment, the size of transistor M31 is 1/n times the size of the transistor M21. In the current amplifier 111, the condition "voltage Va=voltage Vb" is satisfied by a feedback operation.

In such a manner, the relationship between the relative current Iout' and the output current Iout is expressed as follows. Note that resistance R21 is on-resistance associated with the transistor M21, and resistance R31 is on-resistance associated with the transistor M31.

$$Iout \times R21 = Iout' \times R31$$

$$Iout' = (R21/R31) \times Iout \quad (1)$$

In this description, because the size of the transistor M31 is 1/n times the size of the transistor M21, Equation (1) is further expressed by Equation (2).

$$R21 = R31 \times n$$

$$Iout' = (1/n) \times Iout \quad (2)$$

From Equation (2), in the present embodiment, the magnitude of the output current Iout can be determined based on (i) the relative current Iout' and (ii) a relative ratio of the size of the transistor M31 to the size of the transistor M21. Thus, variations in the transistors, as well as voltage dependence and temperature characteristics of each transistor, are negligible.

Therefore, according to the present embodiment, accuracy in detecting the output current Iout derived from the relative current Iout' can be increased, while preventing backflow to protect against the current from the load 30-side.

Hereafter, the operation of the switching circuit 100 according to the present embodiment will be described. In the switching circuit 100 according to the present embodiment, when the logic circuit 130 turns on each of the transistor M11, the transistor M21, and the transistor M31, the VDD terminal and the Vout terminal become conductive. In this case, the output current Iout corresponding to the power supply voltage Vin flows out from the switching circuit 100, via the Vout terminal.

Also, the relative current Iout' derived from the power supply voltage Vin flows out from the switching circuit 100, via the Vs terminal.

According to the present embodiment, when the magnitude of the output current Iout determined based on the magnitude of the relative current Iout' is less than or equal to a threshold, the switching circuit 100 detects that the magnitude of the output current Iout is less than or equal to the threshold. Then, the switching circuit 100 outputs an error signal to the higher level circuit. As an example in which the magnitude of the output current Iout is less than or equal to the threshold, the Vout terminal and a given load 30 are disconnected from each other. Alternatively, another case may be adopted. In other words, the magnitude of the output current Iout is less than or equal to the threshold, in a case or the like where the power source 20 and the load 30 are disconnected from each other.

In the present embodiment, when the magnitude of the output current Iout decreases, the magnitude of the relative current Iout' also decreases accordingly. In the present embodiment, the comparator 150 outputs, to the gate of the transistor M51, the result of comparison of the voltage at the Vs terminal against the reference voltage Vref.

The voltage at the Vs terminal is determined based on the relative current Iout' and resistance of the resistor Rs. If the voltage at the Vs terminal is higher than the reference voltage Vref, the comparator 150 outputs a high level signal to the gate of the transistor M51. In this case, the transistor M51 is in an off state and thus no signal is output from the Err terminal.

If the magnitude of the relative current Iout' is reduced, and thus the voltage at the Vs terminal is lower than the reference voltage Vref, the comparator 150 outputs a low level signal to the gate of the transistor M51. In this case, the transistor M51 becomes in an on state and thus an error signal is output to a higher level circuit, via the Err terminal.

In the present embodiment, accuracy in detecting the output current Iout can be increased, thereby allowing for increased accuracy in determining whether the output current Iout is less than or equal to a given threshold. Accordingly, in the present embodiment, increased accuracy in determining whether the switching circuit 100 and the load 30 are disconnected from each other can be provided.

Note that a method of outputting an error signal from the Err terminal by comparing the voltage at the Vs terminal against the reference voltage Vref is not limited to the example described in the present embodiment, and any appropriate method can be adopted.

Figure 3A:
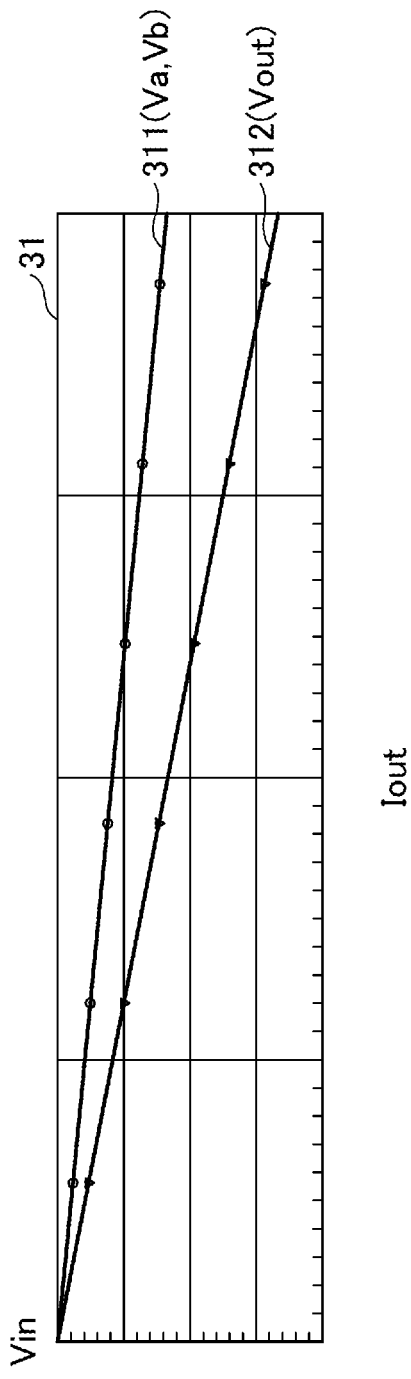
FIG. 3A is a graph illustrating an example of a power supply voltage with respect to an output current during an operation of the switching circuit.
Figure 3B:
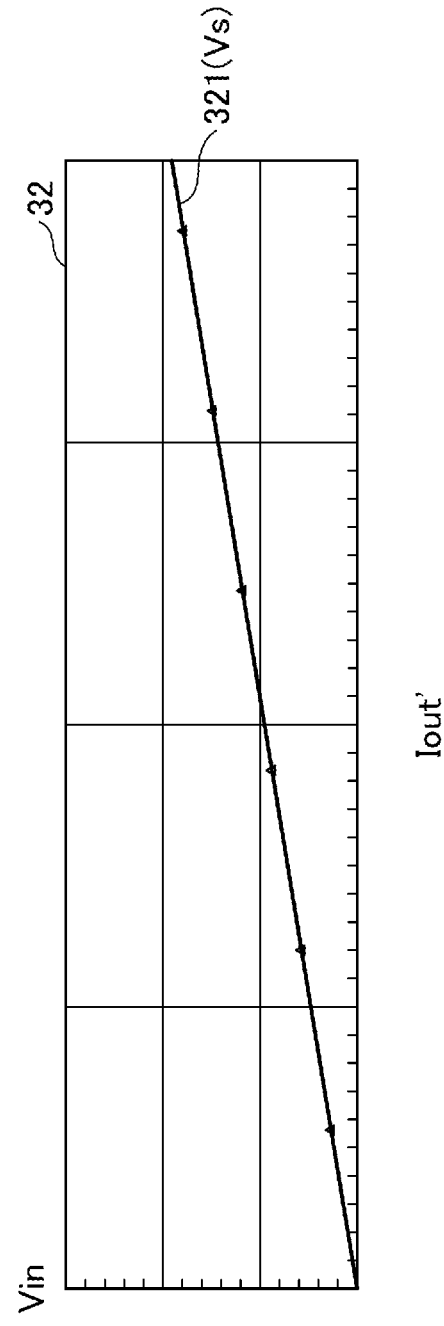
FIG. 3B is a graph illustrating an example of the power supply voltage with respect to a relative current during the operation of the switching circuit.

FIG. 3A is a graph illustrating the power supply voltage Vin with respect to the output current Iout, during operation of the switching circuit. FIG. 3B is a graph illustrating the power supply voltage Vin with respect to the relative current Iout', during operation of the switching circuit.

In each of a graph 31 in FIG. 3A and a graph 32 in FIG. 3B, the horizontal axis represents a corresponding current among the output current Iout and the relative current Iout'. The vertical axis represents the power supply voltage Vin.

In the graph 31, the voltage 311, as illustrated linearly, indicates the voltages Va and Vb at the connection points Pa and Pb. The voltage 312, as illustrated linearly, indicates the output voltage Vout at the Vout terminal. In the graph 32, the voltage 321, as illustrated linearly, indicates the voltage Vs at the Vs terminal.

From the voltage 311 and the voltage 312, as illustrated in the graph 31, it can be seen that as the output current Iout increases, each of the voltages Va and Vb and the voltage Vout decreases with being influenced by on-resistance associated with the transistor M21 and on-resistance associated with the transistor M11.

Also, from the voltage 321 illustrated in the graph 32, it can be seen that as the output current Iout increases, the voltage Vs increases. This is because when the output current Iout increases, the relative current Iout' also increases accordingly.

As described above, according to the present embodiment, accuracy in detecting the output current Iout derived from the relative current Iout' can be increased.

In the present embodiment, each of the transistor M31 and the transistor M41 can be scaled down, thereby allowing for a smaller chip area of the switching circuit 100.

In the present embodiment, the magnitude of a given current used as a threshold at which disconnection of a given load from the Vout terminal is detected can be changed in accordance with the resistance of the resistor Rs. Thus, in the present embodiment, a given threshold to be compared with the output current Iout can be changed by using only the switching circuit 100, without using an analog-to-digital (A/D) converter or the like.

In the present embodiment, when the comparator 150 determines whether the Vout terminal and a given load are disconnected from each other, a voltage across the resistor Rs occurs in response to the relative current Iout' through the resistor Rs, where the resistor Rs is provided externally. Thus, accuracy in determining whether the Vout terminal and a given load are disconnected from each other can be increased.

Second Embodiment

A second embodiment will be described below with reference to the drawings. In the second embodiment, the configuration differs from that described in the first embodiment, in that the relative current Iout' is generated using two transistors. In the present embodiment, description for the configuration that differs from that in the first embodiment will be described below. The same numerals denote the same functional components as those described in the first embodiment, and description for the components will be omitted.

Figure 4:
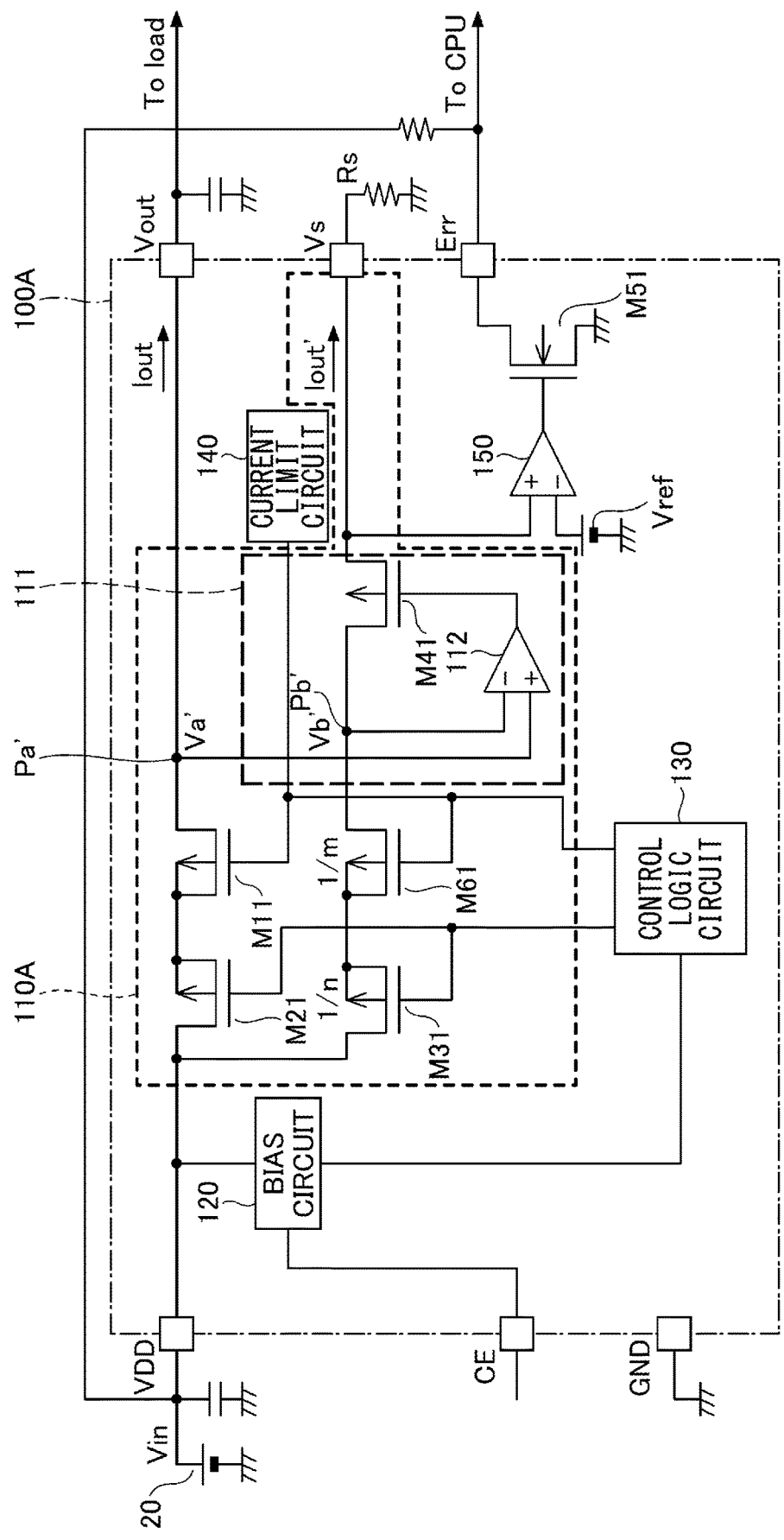
FIG. 4 is a diagram illustrating an example of the configuration of a switching circuit according to a second embodiment.

FIG. 4 is a diagram illustrating an example of the switching circuit according to a second embodiment. A switching circuit 100A according to the present embodiment includes a current detecting circuit 110A, the bias circuit 120, the logic circuit 130, the current limit circuit 140, and the comparator 150. The switching circuit 100A also includes the transistor M51, the VDD terminal, the CE terminal, the GND terminal, the Vout terminal, the Vs terminal, and the Err terminal.

In the present embodiment, the current detecting circuit 110A includes the current amplifier 111 and transistors M11, M21, M31, and M61. The transistor M61 (fourth switching element) according to the present embodiment has the same structure as the transistor M11, and is 1/m times the size of the transistor M11, where m is an integer greater than one. A parasitic diode is coupled in parallel to the transistor M61, such that the current flows in a forward direction from the VDD terminal to the Vs terminal.

In the present embodiment, the current detecting circuit 110A includes the transistor M11 and the transistor M61, where the size of transistor M61 is 1/m times the size of the transistor M11. A gate, which is a control terminal, of the transistor M61 is coupled to the gate, which is a control terminal, of the transistor M11. The transistor M11 and the transistor M61 are turned on or off in synchronization. The logic circuit 130 outputs a signal at high level or low level, to the gate of each of the transistors M11, M21, M31, and M61, to thereby turn on or off a corresponding transistor among the transistors M11, M21, M31, and M61.

An input side of the transistor M61 is coupled to the output side of the transistor M31, and an output side of the transistor M61 is coupled to the input side of the transistor M41. In the following description of the present embodiment, a connection point of the output side of the transistor M61 and the input side of the transistor M41 is a connection point Pb', and a voltage at the connection point Pb' is a voltage Vb'. Note that the resistance R61 is on-resistance associated with the transistor M61.

In the current detecting circuit 110A illustrated in FIG. 4, high voltages Va' and Vb' are respectively obtained by on-resistance associated with the transistor M11 and the transistor M61, in comparison to the voltages Va and Vb described in the first embodiment.

Referring back to FIG. 2, in the current detecting circuit 110, the voltages Va and Vb are expressed as follows.

$$VDD-Va=VDD-Vb$$

$$Va=Vb$$

Where, VDD represents the voltage at the VDD terminal, Va represents the voltage at the connection point Va, and Vb represents the voltage at the connection point Vb.

In this case, the condition of R21×Iout=R31×Iout' is satisfied.

In contrast, in the current detecting circuit 110A illustrated in FIG. 4, the voltages Va' and Vb' are expressed as follows.

$$VDD-Va'=VDD-Vb'$$

$$Va'=Vb'$$

In this case, the condition of (R21+R11)×Iout=(R31+R61)×Iout' is satisfied.

Where R21 is on-resistance associated with the transistor M21, R31 is on-resistance associated with the transistor M31, R61 is on-resistance associated with the transistor M61.

In such a manner, even when the same current Iout' is illustrated in FIG. 2 and FIG. 4, the voltages Va' and Vb' obtained in the current detecting circuit 110A illustrated in FIG. 4 are respectively higher than the voltages Va and Vb obtained in the current detecting circuit 110 illustrated in FIG. 2, thereby resulting in increased relative accuracy for the relative current Iout'. In this case, the effect of an offset or the like of the current detecting circuit can be reduced.

For example, when the size of the transistor M21 is the same as that of the transistor M11, the size of the transistor M31 is also set to be the same as that of the transistor M61. In this case, according to the present embodiment, for transistors M31 and M61 provided in a path into which the relative current Iout' flows, a total value indicating on-resistance associated with the transistors is about twice a total value indicating on-resistance associated with a given transistor M31 described in the first embodiment. Thus, the magnitudes of the voltages Va' and Vb' are respectively about twice the magnitudes of the voltages Va and Vb described in the first embodiment. Note that the transistor M21 and the transistor M11 may differ in size from each other.

In the present embodiment, the size of the transistor M61 is 1/m times the size of the transistor M11, and the size of the transistor M31 is 1/n times the size of the transistor M21. However, such a manner is not limiting. The sizes of the transistor M61 and the transistor M31 may be respectively 1/n times the sizes of the transistor M11 and the transistor M21.

As described above, in the present embodiment, by increasing the magnitude of each of the voltages Va' and Vb', accuracy in detecting the output current Iout can be increased, while preventing backflow to protect against the current from the load 30-side.

What is claimed is:

1. A current detecting circuit comprising:
   a power supply terminal;
   an output terminal;
   a first switching circuit of which an input side is electrically coupled to the power supply terminal, the first switching circuit including a first control terminal;
   a second switching circuit of which an input side is electrically coupled to the power supply terminal, the second switching circuit including a second control terminal electrically coupled to the first control terminal of the first switching circuit;
   a third switching circuit electrically coupled in series with the first switching circuit, an output side of the third switching circuit being electrically coupled to the output terminal;
   a first anti-backflow circuit electrically coupled in anti-parallel with the first switching circuit to prevent backflow from the output terminal into the power supply terminal;
   a second anti-backflow circuit electrically coupled in antiparallel with the second switching circuit to prevent backflow into the power supply terminal; and
   a current amplifier configured to detect a difference between a first output voltage of the first switching circuit and a second output voltage of the second switching circuit, and to output a relative current to be used for detecting an output current that flows out from the output terminal,
   wherein a ratio of resistance associated with the first switching circuit to resistance associated with the second switching circuit is n:1, where n is an integer greater than one.

2. The current detecting circuit according to claim 1, wherein an output of the current amplifier is configured to be electrically coupled to a resistor, such that a voltage occurs across the resistor in response to the relative current through the resistor.

3. A switching circuit comprising:
   the current detecting circuit according to claim 2; and
   a comparator configured to compare a reference voltage against a voltage that is determined based on the voltage occurring across the resistor.

4. The switching circuit according to claim 3, further comprising a circuit configured to control a voltage to be applied to each of the first control terminal of the first switching circuit and a third control terminal of the third switching circuit, such that a current flowing out from the output terminal is delivered or cut off.

5. The current detecting circuit according to claim 1, further comprising:
   a fourth switching circuit electrically coupled in series with the second switching circuit, the fourth switching circuit including a fourth control terminal electrically coupled to the third control terminal of the third switching circuit,
   wherein the current amplifier is configured to detect a difference between a first output voltage of the third switching circuit and a second output voltage of the fourth switching circuit, and to output a relative current to be used for detecting an output current that flows out from the output terminal,
   wherein a ratio of resistance associated with the first switching circuit to resistance associated with the second switching circuit is n:1, where n is an integer greater than one, and
   wherein a ratio of resistance associated with the third switching circuit to resistance associated with the fourth switching circuit is m:1, where m is an integer greater than one.

6. A semiconductor integrated circuit comprising:
   a power supply terminal;

a first output terminal configured to be externally coupled to a load and via which an output current is configured to be output;
a second output terminal;
a control circuit;
a first switching circuit of which an input side is electrically coupled to the power supply terminal, the first switching circuit including a first control terminal;
a second switching circuit of which an input side is electrically coupled to the power supply terminal, the second switching circuit including a second control terminal electrically coupled to the first control terminal of the first switching circuit;
a third switching circuit electrically coupled in series with the first switching circuit, an output side of the third switching circuit being electrically coupled to the output terminal; and
a current amplifier configured to:
 detect a difference between a first output voltage of the first switching circuit and a second output voltage of the second switching circuit,
 generate a relative current proportional to the output current such that a magnitude of the relative current is lower than the output current, and
 output the relative current to the second output terminal,
wherein the control circuit is configured to turn on the first switching circuit and the third switching circuit, so that the power supply terminal and the first output terminal become conductive.

7. The semiconductor integrated circuit according to claim 6, further comprising:
an anti-backflow circuit electrically coupled in antiparallel with the first switching circuit to prevent backflow into the power supply terminal; and
an anti-backflow circuit electrically coupled in parallel with the third switching circuit to enable a flow into the power supply terminal.

8. The semiconductor integrated circuit according to claim 6, wherein the second output terminal is configured to be electrically coupled to an external load.

9. The semiconductor integrated circuit according to claim 8, further comprising:
a comparator configured to compare a reference voltage against a voltage that is determined based on the voltage occurring across the resistor through which the relative current passes.

10. The semiconductor integrated circuit according to claim 9, wherein the control circuit is configured to control a voltage to be applied to each of the first control terminal of the first switching circuit and a third control terminal of the third switching circuit, upon occurrence of a condition in which the voltage across the resistor exceeds the reference voltage, such that,
a current flowing out from the first output terminal is delivered or cut off, and
the power supply terminal and the first output terminal become non-conductive.

11. The semiconductor integrated circuit according to claim 6, wherein the current amplifier includes:
a transistor including a control terminal, and electrically coupled between an output of the second switching circuit and the first output terminal, and
an amplifier configured to detect the difference between the first output voltage of the first switching circuit and the second output voltage of the second switching circuit to output a signal to the control terminal.

12. The semiconductor integrated circuit according to claim 6, wherein a ratio of resistance associated with the first switching circuit to resistance associated with the second switching circuit is 1:n, where n is an integer greater than one.

13. A semiconductor integrated circuit comprising:
a power supply terminal;
a first output terminal configured to be externally coupled to a load and via which an output current is configured to be output;
a second output terminal;
a control circuit;
a first switching circuit of which an input side is electrically coupled to the power supply terminal, the first switching circuit including a first control terminal;
a second switching circuit of which an input side is electrically coupled to the power supply terminal, the second switching circuit including a second control terminal electrically coupled to the first control terminal of the first switching circuit;
a third switching circuit electrically coupled in series with the first switching circuit, an output side of the third switching circuit being electrically coupled to the first output terminal;
a fourth switching circuit electrically coupled in series with the second switching circuit, the fourth switching circuit including a fourth control terminal electrically coupled to the third control terminal of the third switching circuit, and
a current amplifier configured to:
 detect a difference between an output voltage of the third switching circuit and an output voltage of the fourth switching circuit,
 generate a relative current proportional to the output current, and
 output the relative current to the second output terminal,
wherein the control circuit is configured to turn on the first switching circuit and the third switching circuit, so that the power supply terminal and the first output terminal become conductive.

14. The semiconductor integrated circuit according to claim 13, further comprising:
a first anti-backflow circuit electrically coupled in antiparallel with the first switching circuit to prevent backflow from the output terminal into the power supply terminal; and
a second anti-backflow circuit electrically coupled in antiparallel with the second switching circuit to prevent backflow into the power supply terminal.

15. The semiconductor integrated circuit according to claim 13, wherein the second output terminal is configured to be electrically coupled to a resistor, such that a voltage occurs across the resistor in response to the relative current through the resistor.

16. The semiconductor integrated circuit according to claim 15, further comprising:
a comparator configured to compare a reference voltage against a voltage that is determined based on the voltage occurring across the resistor through which the relative current passes.

17. The semiconductor integrated circuit according to claim 16, wherein the control circuit is configured to control a voltage to be applied to each of the first control terminal of the first switching circuit and a third control terminal of the third switching circuit, upon occurrence of a condition in which the voltage across the resistor exceeds the reference voltage, so that the power supply terminal and the first output terminal become non-conductive.

18. The semiconductor integrated circuit according to claim 13, wherein the current amplifier includes:
   a transistor including a control terminal, and electrically coupled between an output of the fourth switching circuit and the first output terminal, and
   an amplifier configured to detect the difference between the output voltage of the third switching circuit and the output voltage of the fourth switching circuit to output a signal to the control terminal.

19. The semiconductor integrated circuit according to claim 18, wherein a ratio of resistance associated with the first switching circuit to resistance associated with the second switching circuit is 1:n, where n is an integer greater than one, and
   wherein a ratio of resistance associated with the third switching circuit to resistance associated with the fourth switching circuit is 1:m, where m is an integer greater than one.

* * * * *